United States Patent [19]

Coffee

[11] 4,381,533
[45] * Apr. 26, 1983

[54] ATOMIZATION OF LIQUIDS

[75] Inventor: Ronald A. Coffee, Haslemere, England

[73] Assignee: Imperial Chemical Industries PLC, London, England

[*] Notice: The portion of the term of this patent subsequent to Oct. 26, 1999, has been disclaimed.

[21] Appl. No.: 322,687

[22] Filed: Nov. 18, 1981

Related U.S. Application Data

[63] Continuation of Ser. No. 79,950, Sep. 28, 1979, which is a continuation-in-part of Ser. No. 812,440, Jul. 1, 1977, abandoned.

[30] Foreign Application Priority Data

Jul. 15, 1976 [GB] United Kingdom ............. 29539/76
Feb. 21, 1977 [GB] United Kingdom ................. 7186/77

[51] Int. Cl.³ .............................................. B05B 5/02
[52] U.S. Cl. ..................................... 361/228; 118/626
[58] Field of Search ............... 361/226, 227, 228, 235; 118/626, 627, 628

[56] References Cited

U.S. PATENT DOCUMENTS

| | | | |
|---|---|---|---|
| 1,958,406 | 5/1934 | Darrah | 55/123 X |
| 2,826,513 | 3/1958 | Blanchard | 239/3 |
| 2,893,893 | 7/1959 | Crouse | 118/626 X |
| 2,955,565 | 10/1960 | Schotland | 239/707 X |
| 3,212,211 | 10/1965 | Bennett | 361/227 X |
| 3,339,840 | 9/1967 | Point | 239/3 |
| 3,521,125 | 7/1970 | Nelson | 361/227 |
| 3,997,817 | 12/1976 | Secker | 361/235 X |
| 4,009,829 | 3/1977 | Sickles | 361/228 X |

FOREIGN PATENT DOCUMENTS 1156341 10/1963 Fed. Rep. of Germany ...... 118/626
247126 11/1969 U.S.S.R. .............................. 239/690

OTHER PUBLICATIONS

"Application of Electrostatic Charging to the Deposition of Insecticides and Fungicides on Plant Surfaces"—Bowen et al.; Agricultural Engineering 6/57, pp. 347-350.

"Generation of Charged Drops of Insulating Liquids by Electrostatic Spraying"-Kim et al.; Journal of Applied Physics vol. 47, No. 5, pp. 1964-1969, 5/76.

Primary Examiner—Harry E. Moose, Jr.
Attorney, Agent, or Firm—Cushman, Darby & Cushman

[57] ABSTRACT

Spraying apparatus for spraying liquid pesticides on to crops growing in the ground includes a plurality of electrostatic spraying devices mounted on a boom which can be mounted on a powered vehicle such as a tractor or an aircraft. Each spraying device includes a spray-head having an at least electrically semi-conducting surface charged to a potential of the order of 1-20 kilovolts, a field intensifying electrode mounted adjacent the spray-head surface and being so sited relative to the spray-head surface that the electrostatic field thereat causes pesticide liquid delivered thereto to atomize without substantial corona discharge to form electrically charged particles.

4 Claims, 14 Drawing Figures

ATOMIZATION OF LIQUIDS

This application is a continuation of application Ser. No. 79,950 filed Sept. 28, 1979 which is a continuation-in-part of application Ser. No. 812,440, filed July 1, 1977, now abandoned.

This invention relates to the spraying of pesticides, and to apparatus therefor.

The application of liquid formulations to crops by means of sprayers has been practised for many years, and a wide variety of machines has been used or proposed for the purpose. More recently it has become apparent that a crucial feature of pesticide sprayers is the particle size of the spray droplets they produce. Many simple pressure nozzle designs produce a broad spectrum of spray droplet sizes, e.g. from about 10 microns to about 500 microns in diameter. Of these, the larger droplets are less effective in biological action, while the smaller droplets are prone to drift in air currents, and may thus be carried away from the target for which they are intended (which is wasteful) to other parts of the environment (where they may cause actual harm). Different sizes of spray particle are required for different purposes. Thus, the ideal size of spray particle of a particular insecticide, for use against a particular insect pest in a particular crop, may be as low as 30 microns. For a herbicide, in particular circumstances, the ideal droplet size may be 200 microns. Sprayers which can be set to reliably produce spray droplets of each of these sizes (or other desired sizes in between) with few droplets either substantially larger or smaller, have been sought for some time.

Most pesticides are applied to crops as water-based sprays. The active ingredient, in the form of a concentrated formulation which may be either solid or liquid, is added to a spray-tank containing water (typically carried on a tractor), the contents being thoroughly mixed, and applied to crops. The water-based spray is normally very dilute. A typical rate of pesticide application would be 1 kilogram of active ingredient per hectare, while a typical rate of application of diluted spray might be 200–500 litres per hectare. Thus the concentration of pesticide in the spray may be of the order of 0.5% or less.

This method of application thus involves the unnecessary transport of large volumes of water. On a large scale, a tractor is required to carry the water around. In some terrains (e.g. steep hillsides) tractors cannot operate; and in some countries water is not readily available in large quantities. For this and other reasons, systems have been developed for spraying using much lower volumes of diluent. So-called 'ULV' (ultra-low volume) techniques use a spray application rate of from about 0.1 to about 5 litres per hectare. Typically oils are used as the spray diluent. The sprays are obviously much more concentrated than the high-volume aqueous sprays and so much less weight of spray is required per unit area. Thus ULV techniques are much better suited to spraying systems carried by men, or by aircraft, than are more conventional techniques. They can also be safer and more reliable, as pesticide formulations can be supplied ready for use, eliminating operator errors in dilution and reducing opportunities for spillage and poisoning accidents.

In recent years, substantial advances have been made in pesticide sprayers that will give spray droplets of consistent and controllable size, particularly for ULV spraying. Sprayers have been produced in which the liquid pesticide is atomised by being flung off a spinning disc or cup. In such sprayers, the droplet size depends, for a given disc diameter, on the speed of rotation of the disc; and the size distribution is remarkably narrow. Hand-held ULV sprayers using this principle have commanded a wide market in several parts of the world, and in particular in Africa for insecticide treatment of cotton. Nevertheless they have some drawbacks. The rotating discs are driven by electric motors powered by dry cells, and these have to be replaced at quite frequent intervals. Also a hand-held device of this kind, containing a motor and other moving parts, is inherently liable to occasional defects, e.g. through misuse.

Paint-spraying has for many years been carried out by means of sprayers which impart an electrostatic charge to the paint spray particles. Electrostatic paint-spraying has a number of advantages. The charged particles are attracted to the object being sprayed, and thus less are wasted; the electrostatic field promotes adhesion and even coating; moreover the field carries particles round behind the object, to coat the back of it. Apparatus used in electrostatic paint-spraying has been of two types, both associated with the name of Ransburg. In the earliest apparatus, paint was atomised from a conventional nozzle, and passed through a wire grid mesh, held at a potential of the order of 100,000 volts. This charged the paint spray by ionic bombardment. In a subsequent development, paint was supplied to a rotating disc, from the edges of which it atomised as charged particles under the influence of a high potential (usually about 70,000–80,000 volts) applied to the disc. Other devices have been proposed in which the paint is atomised by air blast, before or during charging. First introduced in the 1940's, electrostatic paint-spraying machines are in widespread use today, typically for such applications as painting automobile parts. They require considerable amounts of electric power, usually provided from mains electrical supplies, and are not readily portable.

It has been recognised for many years that electrostatic spraying of pesticides could have advantages corresponding to those obtainable by electrostatic paint spraying, i.e. more even coating of plants, including coating of the backs of leaves, better adhesion to plants, and less pesticide wasted (in particular, by loss of pesticide to the surrounding environment, where it may do harm). A number of prior proposals for applying electrostatically charged pesticides (usually as particulate solids) have been made, but to the best of Applicant's knowledge no such prior proposals have yet come into substantial commercial use anywhere in the world. Difficulties have arisen in part from the need to use high potentials to charge the pesticide sprays, which in turn have required expensive and bulky apparatus, which in some cases has been too heavy even to be conveniently carried on a tractor.

Objects of the present invention include the following:

to provide a practical system for the electrostatic spraying of liquid pesticides;

to provide an improved process for ULV spraying of pesticides, in which particle size may be readily controlled, using apparatus which is simple, reliable, light enough to be held in the hand or readily carried by aircraft, and has a much reduced power requirement compared with known ULV spraying devices;

to provide a system wherein pesticides may be sprayed on to plants with better and more even coverage of foliage, and less loss of pesticide to the environment, offering possibilities of saving in pesticide usage.

These and other objects may be attained by the following invention, which consists in spraying apparatus for use in the electrostatic spraying of pesticides which comprises a spray-head having an at least semi-conducting surface; means for electrically charging the spray-head to a potential of the order of 1-20 kilovolts; means for delivering pesticide spray liquid to the surface; a field intensifying electrode mounted adjacent to the surface, and means for connecting the field intensifying electrode to earth; the electrode being so sited relative to the surface that when the surface is charged, the electrostatic field thereat causes liquid thereon to atomise without substantial corona discharge to form electrically charged particles which are projected away from the electrode.

The invention further consists in a process of spraying liquid pesticides at ultra-low volume, which comprises supplying a relatively concentrated composition of a pesticide in an organic diluent to an electrically conducting surface adjacent a field intensifying electrode, the electrode being at such a potential and so sited relative to the surface that an atomising field strength is created at the surface so that the liquid is atomised at least preponderantly by electrostatic forces substantially without corona discharge to form electrically charged particles which are projected away from the electrode.

When a liquid is displaced from the locality of an electrically conducting surface at a voltage above or below earth potential the liquid may upon emerging into free space carry a net electrical charge resulting from an exchange of electrical charges with the source of the electrical potential. In our invention, this technique is used to atomise the displaced liquid since the net electric charge in the liquid as the liquid emerges into free space from the locality of the conducting surface counteracts the surface tension forces of the liquid. The amount of electrical charge in the emerging liquid droplets after atomisation is, in part, dependent upon the strength of the electric field at the conducting surface.

A salient feature of known paint-spraying devices is that a combination of high voltage and sharp-edged conducting surfaces causes breakdown of the surrounding air (by the phenomenon known as corona discharge). The effect of this is that not all of the current supplied to the conducting surface is used to charge the liquid. Thus, corona discharge results in unnecessary current loss and greatly increases the current drawn from the source of high electrical potential. This has disadvantages. One serious disadvantage is that the power required of the high electrical potential source is too high to be met easily by portable energy sources e.g. torch batteries.

In the present invention an electrode hereinafter referred to as a field intensifying electrode, is placed in close proximity to the conducting surface and enables a sufficiently high field strength to be created at the conducting surface using a relatively low voltage, of the order of 1-20 KV, to charge the droplets. Thus a high charge density for example, of the order of $10^{-2}$ coulombs/kilogram may be placed upon the liquid. This gives rise to a high charge-utilisation efficiency which in turn enables low power sources, such as piezo-electric crystals, torch batteries or solar cells to be utilised as a charge transfer device, and to give rise to electrostatic atomisation of the liquid.

Such atomisation requires no mechanical assistance such as an air blast or rotating disc. The combined field due to the voltage on the conducting surface plus the space charge of the atomised liquid itself then enables the droplets to be targeted toward an earthed object, or to form an airborne (aerosol) cloud.

The field intensifying electrode may be considered to be a 'dummy target' since it strongly influences the field in the region of liquid atomisation. But, unlike an actual target, it is placed close to the conducting surface thus strengthening the field. We have found that the field adjusting member may easily be placed so that it does not itself become a target for the atomised spray.

The reason for this is not fully understood, but observation shows that, provided the liquid's physical characteristics (e.g. resistivity, viscosity) and flow rate are such as to cause the liquid to leave the conducting surface under the action of the electrostatic field in the form of ligaments of about 1 cm or more, the atomisation will take place in that part of the electric field where the combined forces of inertia, gravity field, and electrostatic field are directed away from the field intensifying electrode.

It has been found possible to cause impingement of the spray on to the field intensifying electrode by placing it downstream of the atomising tip of the ligament. In this case it has been noticed that, with relatively small amounts of impinging liquid, that provided the surface of the field intensifying electrode is sufficiently conducting, and earthed, the impinging particles give up their charge and take up an opposite charge by induction in the electric field. This causes them to re-atomise and not to be retained on the electrode. Moreover, any very small droplets which may be formed in the atomisation process are preferentially captured by the electrode because of their low momentum.

By the term 'conducting surface' we mean the surface of a material having a resistivity of the order of 1 ohm cm or less, and by 'semi-conducting surface' we mean the surface material having a resistivity value of between 1 and about $10^{12}$ ohm cm. By 'insulating material' is meant material having a resistivity of more than $10^{12}$ ohm cm.

The conducting or semi-conducting surface adjacent which the liquid atomises may have various shapes. It will often be the end of a spray conduit, preferably a conduit of capillary size, for example, a nozzle aperture, through which in operation the liquid spray emerges.

The conducting surface may also comprise the edges of two concentric tubes which edges define an annular aperture through which liquid emerges. The edges of the tubes may be serrated or fluted. Alternatively, the conducting surface may comprise two edges defining a slot, preferably of capillary width. The slot may be of rectangular or other form. Atomisation may be effected from the flat surface of a solid conductor or semiconductor to which liquid has been supplied.

The geometric shape of the field intensifying electrode in general follows the shape of the conducting or semi-conducting surface. Where the surface is defined by a nozzle the electrode may take an annular form with the member encircling the nozzle.

The field intensifying electrode is generally sited as close as possible to the conducting surface without corona discharge occurring between them. For example with 20 KV on the conducting surface the electrode is preferably sited not less, and not much more than, about 2 cm away from it. The electrode may be sited either level with, in front of, or behind the conducting surface from which the liquid atomises. In one form of the invention the field intensifying electrode has an insulating surface. For example, it may be a thin wire embedded in a body or sheath formed of a plastics material. This enables the distance between the electrode and the conducting surface to be very much smaller than would be obtainable with 'air-gap' insulation only. This results in an enhanced field strength in the locality of the conducting surface.

The field intensifying electrode may be adjustably mounted on the apparatus of the invention so that the spatial relationship between the electrode and the surface can easily be varied.

We have found that the position and the geometric shape of the field intensifying electrode control the angle of the stream of droplets emerging into free space. When the electrode is behind the emerging spray the angle of the stream is increased, and when it is in front of the emerging spray the angle is decreased.

In addition, we have found that the average size of the atomised droplets in general may be controlled by the position of the field intensifying electrode in relation to the conducting surface. For example, for a given flow rate of liquid, bringing the electrode closer to the conducting surface results in the droplets generally being of a smaller average size. This is because the field at the surface is intensified; a similar control of droplet size may be obtained by increasing or decreasing the applied voltage, which causes a corresponding increase or decrease in the electrostatic field and a consequent decrease or increase, respectively, in particle droplet size.

By controlling the electrostatic field a selected size of droplets may be produced suitable for a particular use. For example, large numbers of small particles (e.g. 20–30μ) of an insecticide may be preferred for maximum coverage of a target, whereas for a herbicide larger droplets less prone to wind drift may be required. This selected droplet size can be maintained notwithstanding the movement of the target relative to the conducting surface because the field strength created between the field intensifying electrode and the surface outweights that produced by the target.

We have found also that for a given voltage and a fixed field intensifying electrode position the droplet size of a fiven liquid is related to throughput.

The apparatus may also comprise one or more additional electrodes to further influence the spray pattern. For example, if in a system comprising a conducting nozzle and an earthed circular field intensifying electrode around it, a second earthed circular member is placed outside the first, this will broaden the spray swath; and conversely a second earthed circular member of smaller cross-sectional area disposed downstream of the nozzle will narrow the spray swath.

We have found that how well a liquid is atomised depends on the potential on the surface, the position of the field intensifying electrode, the liquid throughput, and the nature of the liquid. For practical purposes we have found that highly non-polar liquids, e.g. pure hydrocarbon solvents, and highly polar liquids, such as water, do not atomise so well. Our invention is particularly suited to the atomisation of pesticides dissolved or suspended in organic liquid diluents, in particular formulations having a viscosity at 20° C. of between 1 and 50 centipoises and a resistivity at 20° C. of between $10^6$ and $10^{10}$ ohm centimetres.

Atomisation of a liquid effected by the process or apparatus according to the invention requires no mechanical assistance such as a forced air blast or rotating disc. However, once the liquid has been atomised and has passed out of the atomising field a forced air blast may be used to project the atomised droplets over greater distances to a target, thus for example assisting penetration through foliage.

As previously discussed, the use of a rotating disc as a surface to atomise liquid pesticides is known. However, if such a surface is charged and provided with a contiguous field intensifying electrode, atomisation and spraying trajectories are influenced by both inertial and field-effect 'electrostatic' forces. Surprisingly, it is found that both of these forces combine favourably even at potential differences of the order of 10 KV or less, to produce much finer atomisation than would be obtained from the inertial effect alone. For example, with air-gap insulation only between the field intensifying electrode and the conducting surface at a potential difference of about 20 KV, using a 3-inch diameter disc rotating at 1,500 revolutions per minute as the conducting surface, a droplet mean diameter of the order of 20–30 $\mu$ has been observed at a flow rate of 1.0 cc per second. Other combinations of rotational speed and applied voltage give different effects. It is possible to use relatively low voltages (of the order of 1 KV or so) and rather higher rotational speeds (say 5,000 to 8,000 rpm) to give particles of a useful size range.

Under certain conditions, for example if the throughput of liquid is high enough, a powerful space-charge may be created between the spray nozzle and its target due to the presence of large numbers of charged particles. This space-charge may be sufficiently large to repel very fine charged particles emerging from the nozzle, giving them an appreciable component of velocity in a direction normal to, or even opposite to, the nozzle-target direction. We have termed this effect 'back-spray'.

A suitably placed deflector electrode at a high potential may prevent this 'back-spray'.

Accordingly, in a further feature of the invention there is provided spraying apparatus comprising spraying apparatus according to the invention as hereinbefore defined and further comprising a deflector electrode capable of receiving a high potential and so sited in relation to the nozzle spray that 'back-spray' is prevented.

The deflector electrode may be formed of a metal such as steel or aluminium. When the field intensifying member is of an annular form the deflector electrode may take the form of a co-axial ring of slightly greater diameter than that of the field intensifying electrode, and disposed slightly behind it. The deflector electrode may be mounted on an insulating support so as to be fixed in space and retain charge. A disc formed of a plastics material such as "Perspex" may be used for this purpose.

The voltage on the deflector electrode may be set by either:

(a) a tapping from the high-voltage source used to charge the conducting surface of the spraying apparatus, either directly, or via a potential divider of very high resistance to prevent unwanted power dissipation; or, (b) a separate source of high voltage, which could be of lower power rating since the deflector electrode is not essentially an active device because no power is consumed in its operation.

Typically, when the conducting surface has a voltage of 20 KV, a suitable voltage for the deflector electrode would be 15–20 KV. Also, typically, the total resistance of a suitable potential divider would be of the order of $10^{11}$ ohms. Such as resistance can be realised by use of a semi-insulating material of about 2 cm length and of 1 square cm cross-section (any geometric shape) having electrodes placed at the ends of the material, and together with a tapping electrode suitably set between the ends to obtain the potential division required. Strips of wood, cardboard, and rubber-like materials may be used.

In yet a further feature of the invention there is provided spraying apparatus which comprises two or more spraying devices according to the invention mounted on a boom. The boom may be hand-held, or mounted on, or comprising part of, a tractor or aircraft. Such devices according to the invention are of particular use in multi-row crop spraying, and for the spraying of crops and weeds by aircraft mounted sprayer.

Some embodiments of the invention will now be described, by way of example only, with reference to the accompanying drawings, in which.

Figure 1:
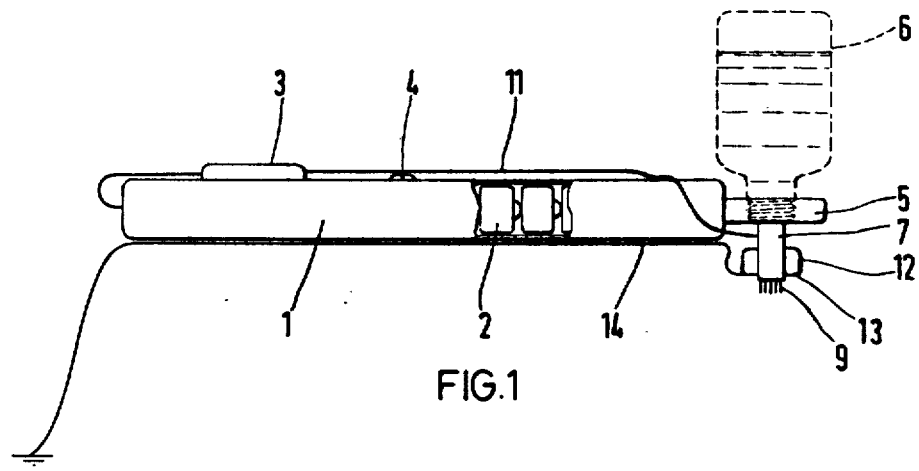
FIG. 1 is an elevational view, schematically illustrating the principal components, of a preferred electrostatic spray gun according to the invention.

Referring to FIG. 1, the electrostatic spray gun comprises a hollow tube 1 formed of a plastics material and providing a firm holding support for other parts of the gun. Within the tube 1 is a bank of sixteen 1½ volt batteries 2 which acts as the electrical energy source. Attached to the side of the tube 1 is a Brandenburg 223P (0–20 KV, 200 microamp) high voltage module 3 connected to the batteries 2 and to a 'ON-OFF' switch 4, and providing a source of high electrical potential. The tube 1 at its forward end has an integral, internally screw-threaded eye 5 adapted to receive a bottle 6 containing liquid to be sprayed. The eye 5 at its lower part holds the upper part of a tubular distributor 7 formed of an insulating plastics material and supporting in its lower end a disc 8 (FIG. 2) of the same material. Now, referring more specifically to FIG. 2, projecting through the disc 8 are eight metal capillary tubes 9 which form the spray nozzle assembly. The capillary tubes 9 are each soldered to a bare-metal wire 10 which in turn is connected to the high potential terminal of the module 3 via a high potential cable 11.

Encircling the distributor 7 is an inverted dish 12 formed of an insulating plastics material. Supported in the lip of the dish 12 is a metal field intensifying ring electrode 13 electrically connected to earth by an earth lead 14. The dish 12 may be moved up and down the distributor 7 bit fits sufficiently closely thereon to maintain by frictional engagement any position selected.

To assemble the spray gun for use, the bottle 6, containing liquid to be sprayed, is screwed into the eye 5 while the spray gun is inverted from the position shown in FIG. 1. Inverting the spray gun back to the position shown in FIG. 1 allows the liquid to enter the distributor 7 and to drip out of the capillary tubes 9 under gravity flow.

In operation to spray liquid, the spray gun is held by hand at a suitable position along the length of the tube 1.

On turning switch 4 to its 'ON' position, the capillary tubes 9 become electrically charged to the same polarity and potential as the output generated by the module 3. This results in the liquid emerging from the tubes in an atomised and electrostatically charged form when the gun is inverted to the spraying position.

When the field intensifying electrode 13 is earthed, via earth lead 14, the electrostatic field at and around the capillary tubes 9 improves both the atomisation and the spray pattern even when the potential on the spray nozzle assembly is at only, say, 10 to 15 kilovolts (either positive or negative polarity with respect to the field intensifying electrode 13). Furthermore, due to the close proximity of the field intensifying electrode 13 to the spray nozzle assembly, the current drawn from the source of high potential 3 is mainly that which arises from an exchange of charge between the capillary tubes 9 and the liquid being sprayed, and is thus extremely small.

Typically, the charge density of the atomised liquid is $1\times10^{-3}$ coulomb per liter. Thus, at a liquid flow rate of, say $1\times10^{-3}$ liter per second the current drawn from the module 3 is only $1\times10^{-6}$ ampere, indicating an output power of only $1\times10^{-3}$ watt when the high potential is $1\times10^{3}$ volts. At this low power, the useful life of the batteries 2 used to energise the module 3 may be hundreds of hours. Even if the charge density is raised somewhat (e.g. to $10^{-2}$ coulombs per liter) the power consumption can still be very low (e.g. 200 milliwatts).

To maintain the electrode 13 at low or zero potential, the earth lead 14 must contact actual ground or some other low voltage, high capacitance, body. For portable use of the spray gun shown in FIG. 1, it is sufficient to trail the earth lead 14 so that it touches or occasionally touches the ground. The spray gun may be used for short periods of time without the earth lead 14 being connected to earth, without noticeably affecting the spray characteristics. Even when the earth lead 14 is not electrically earthed at all the spray gun will continue to spray electrostatically, albeit with a deterioration in performance.

By varying the position of the dish 12 along the length of the distributor 7 the position of the electrode 13 may be adjusted with respect to the fixed position of the capillary tubes 9 so as to achieve the best spray characteristic in accordance with the potential difference between the electrode 13 and the capillary tubes 9, and other variables such as the electrical resistivity of the liquid.

The specific embodiment described hereinabove was tested as described below.

In a first test conducted outdoors a liquid insecticide formulation (resistivity approximately $5 \times 10^8$ ohm cm) was electrostatically sprayed against a set of earthed vertically placed metal tubes, each of 1 inch diameter, placed in a downwind line at distances of 1 to 15 meters from the spray gun; the liquid being atomised at a height of about 1 meter above the ground. A comparative test was conducted using a commercially available mechanical atomising device used for agricultural spraying wherein atomisation is produced from an uncharged spinning disc.

It was found that the droplets from the electrostatic spray gun were deposited more uniformly on all of the metal tubes than those from the mechanical atomiser. The electrostatic spray gun clearly demonstrated a significant 'wrap-round' effect.

In a second test, the first test was repeated but with the 223P; 0-20 KV; 200 microamp module 3 (ex. Brandenburg Ltd) being replaced with a 11 KV unit having no regulation or feedback control and being capable of delivering an output of only1 microamp at about 11 KV.

In this test the liquid was electrostatically atomised and sprayed satisfactorily.

The apparatus shown in FIG. 1 may be used to produce an electrostatically charged pesticide aerosol cloud, i.e. a cloud of droplets having a mean droplet size of less than 50 microns in diameter and generally in the range of 1-10 microns. The apparatus of FIG. 1 having capillary tubes with an internal diameter of 0.1 mm, and using a liquid having a resistivity approximately $5 \times 10^8$ ohm meter at a total flow rate of 0.05 cc/second per eight capillary tubes produces such an aerosol cloud.

Figure 5:
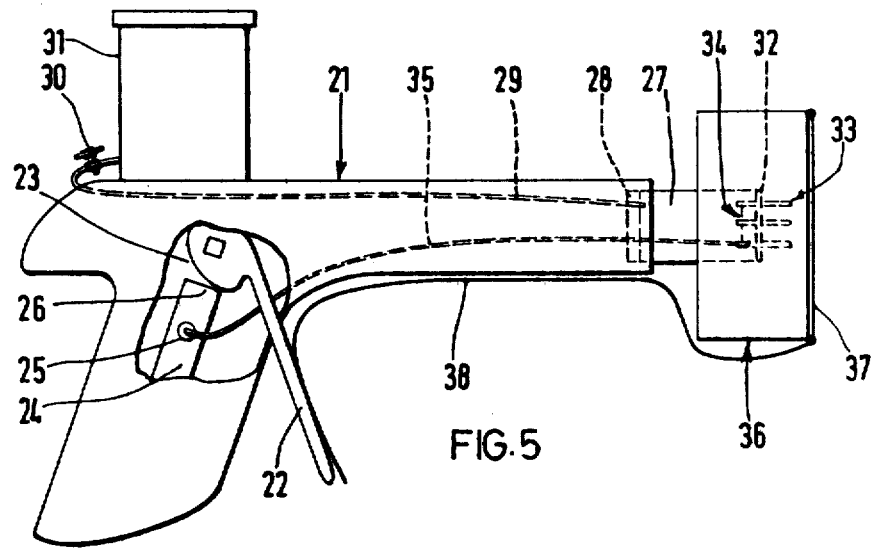
FIG. 5 is an elevational view, part cut away, schematically illustrating the principal components of a spray pistol according to the invention.
Figure 6:
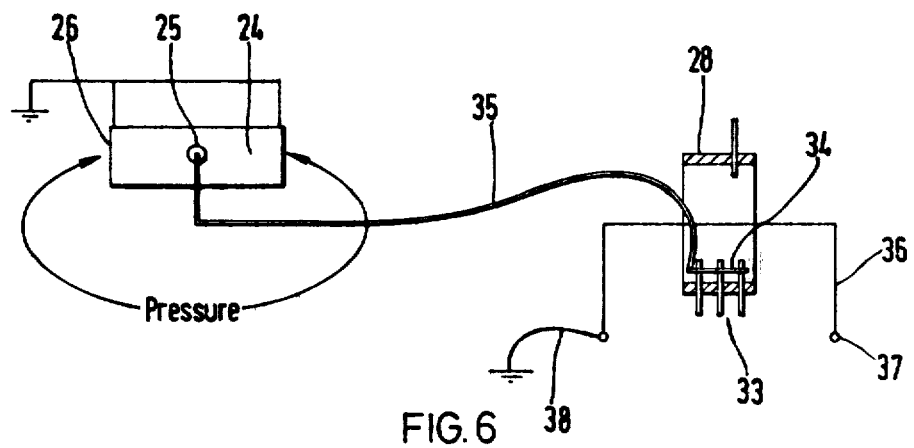
FIG. 6 is an electrical circuit diagram of the spray pistol of FIG. 5.

A further embodiment of the invention is the electrostatic spray hand pistol shown in FIG. 5. In this embodiment the source of high potential comprises lead zirconate crystals which generate the potential by means of the well-known 'piezoelectric effect'.

The hand pistol shown in FIG. 5 comprises a pistol-shaped casing 21 formed of an insulating plastics material, and a metal trigger 22 (shown in FIG. 5 in a released position). The upper part of the trigger 22 is shaped to form a cam 23.

Within the handle of the pistol are two lead zirconate crystals 24 (type PZT4, manufactured by Vernitron Ltd, Southampton, England) having a centre tap connection 25. The crystals 24 each have an upper face 26 which in operation is acted upon by the cam 23.

Fitted to the end of the nozzle of the pistol is a distributor 27 formed of an insulating plastics material which holds at its end adjacent the nozzle a disc 28 formed of the same material. Protruding through the disc 28 into the distributor 27 is a feed tube 29, having a tap 30, which is connected to a feed bottle 31 which holds the liquid to be sprayed.

The distributor 27 at its other end has a disc 32 formed of an insulating plastics material through which protrude eight metal capillary tubes 33 which form the spray assembly. The capillary tubes 33 are each soldered to a bare-metal wire 34 which in turn is connected to the centre tap connection 25 via a high potential cable 35 provided within the barrel of the pistol.

Encircling the distributor 27 is a cylindrical support 36 formed of an insulating plastics material. The support 36 may be moved along the length of the distributor 27 but fits sufficiently closely thereon to maintain by frictional engagement any position selected. Embedded in the support 36 is a metal field intensifying ring electrode 37 which is electrically connected to the trigger by an earth lead 38.

In operation to spray liquid, the tap 30 is turned on. This allows liquid to flow under gravity from the feed bottle 31 along the feed tube 29 into the distributor 27 and to emerge dropwise out of the capillary tubes 33.

On squeezing the trigger, the cam 23 acts on the faces 26. This action compresses the crystals 24 and results in the generation of a potential difference, which is transmitted via the cable 35 to the capillary tubes 33. This results in the liquid emerging from the tubes 33 in an atomised and electrostatically charged form.

When the electrode 37 is earthed, via earth lead 38, trigger, and operator, the electrostatic field at and around the capillary tubes 33 improves both the atomisation and the spray pattern.

By varying the position of the support 36 along the length of the distributor 27 the position of the electrode 37 may be adjusted with respect to the fixed position of the capillary tubes 33 so as to achieve the best spray characteristic in accordance with the potential difference between the electrode 37 and the capillary tubes 33, and other variables such as the electrical resistivity of the liquid.

Typically, the crystals 24, when squeezed slowly for five seconds or so, produce a potential difference of about 10 KV, and have sufficient electrical capacitance to impart at least one microcoulomb to the liquid being atomised during a five second squeeze. If the liquid output rate is about $1 \times 10^{-4}$ litre per second the charge density of the atomised droplets is of the order of $2 \times 10^{-3}$ coulombs per litre.

In a spray test using this specific embodiment the resultant spray exhibited satisfactory atomisation and 'wrap-round' when a target tube was earthed and held at a distance of about 0.5 meter.

The pistol illustrated may readily be modified by means of a mechanical connection between the trigger 22 and a valve in the feed tube 29, so arranged that pressure of the trigger opens the valve and release closes it. In this way liquid only passes through the nozzles 33 when they are charged.

Figure 2:
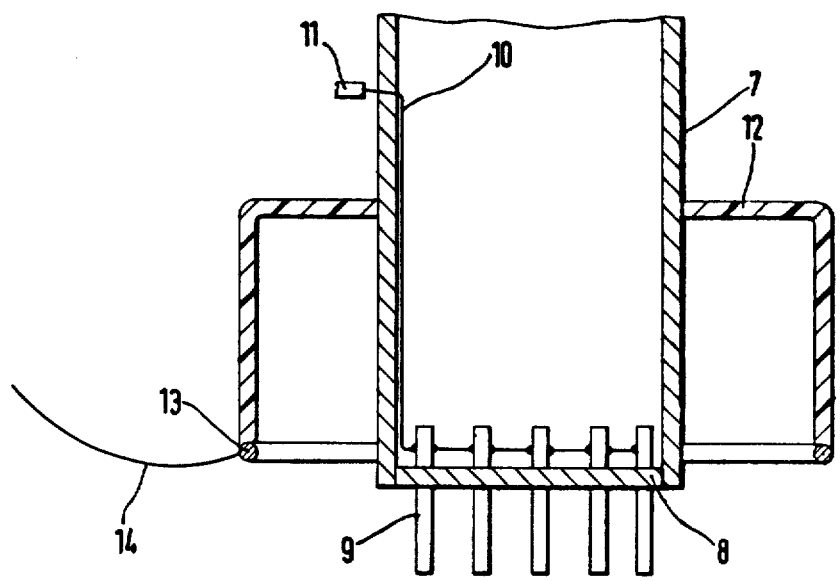
FIG. 2 is a cross-sectional view of the gun nozzle as shown in FIG. 1.
Figure 3:
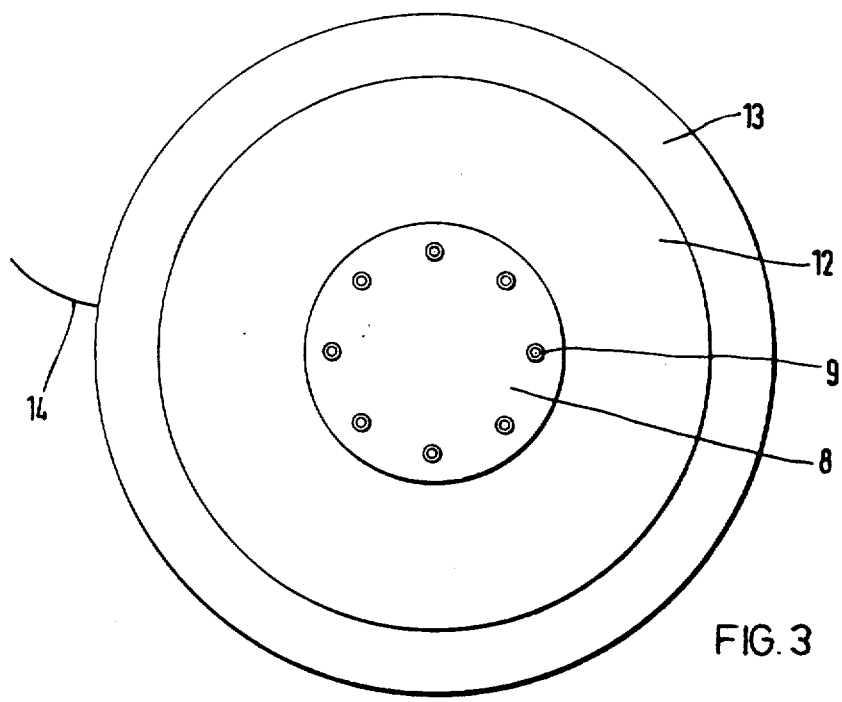
FIG. 3 is an underside view of the gun nozzle of FIG. 2.
Figure 4:
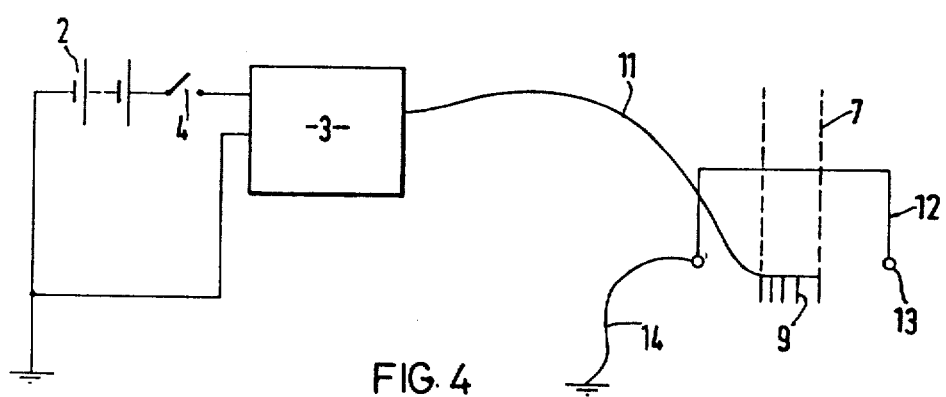
FIG. 4 is an electrical circuit diagram of the spray gun of FIG. 1.
Figure 7:
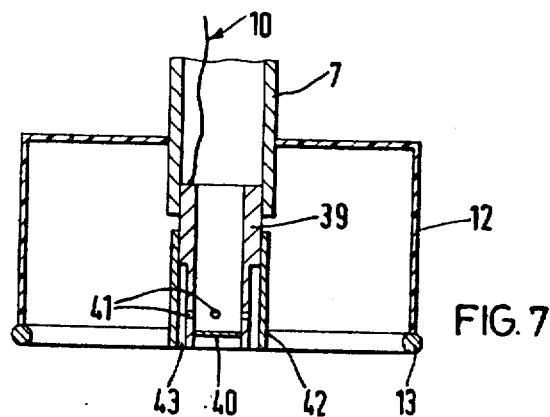
FIG. 7 is a cross-sectional view of a gun nozzle comprising two concentric tubes for a spray gun according to the invention.
Figure 8:
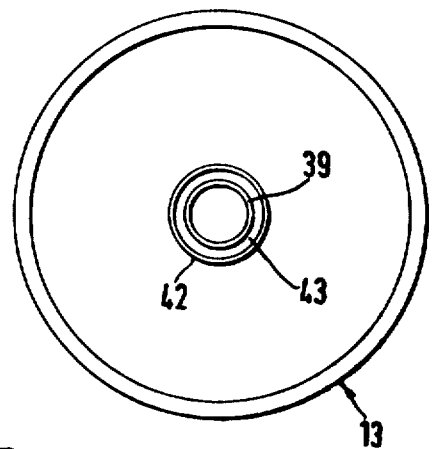
FIG. 8 is an underside view of the gun nozzle of FIG. 7.
Figure 9:
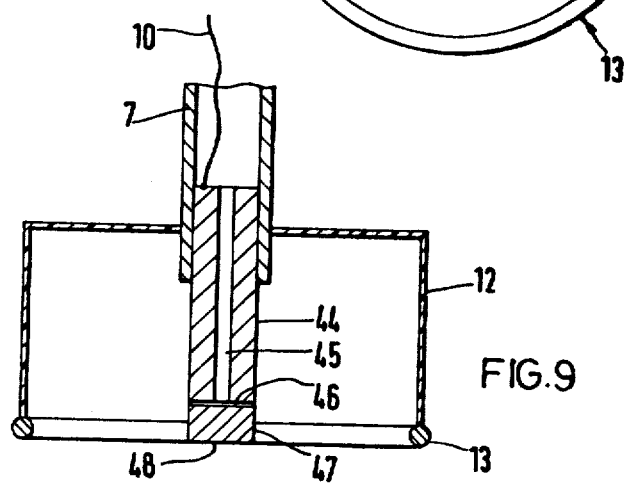
FIG. 9 is a cross-sectional view of a gun nozzle comprising a solid conducting block for a spray gun according to the invention.

Alternative gun nozzles which may be substituted for the nozzle of FIG. 2 in the gun of FIG. 1 are shown in FIGS. 7-9.

The nozzle shown in FIGS. 7 and 8 comprises a hollow steel cylinder 39 having a uniform bore and a lower half of reduced external diameter. The cylinder 39 at its upper part is held by frictional engagement within the tubular distributor 7 of FIG. 1 and connected via metal wire 10 and cable 11 to the high potential terminal of the module 3. At its lower part cylinder 39 is closed by seal 40 and has four holes 41 of capillary size extending radially of the cylinder wall.

An outer steel cylinder 42 at its upper part embraces an intermediate part of the cylinder 39 and is held by frictional engagement thereon. At its lower part cylinder 42 defines, with the lower part of cylinder 39, an annular cavity 43. The holes 41 connect the cavity 43 with the inside of cylinder 39.

Encircling the distributor 7 is the dish 12 supporting the field intensifying ring electrode 13.

In use, turning the switch 4 to its 'ON' position, cylinders 39 and 42 become electrically charged. Liquid passing through distributor 7 passes out of holes 41 into cavity 43 and emerges therefrom in an atomised and electrostatically charged form.

The nozzle shown in FIG. 9 comprises a solid steel cylinder 44 held at its upper part by frictional engagement with the distributor 7 of FIG. 1. The cylinder 44 has a central axial bore 45 running almost the length of the cylinder and terminating at a transverse bore 46 in the lower part of the cylinder. The cylinder 44 is connected to the module 3 via the metal wire 10 and cable 11. The lower part of the cylinder terminates as a solid disc 47 having a bottom surface 48.

In use, when cylinder 44 becomes electrically charged, liquid from distributor 7 passes through bores 45 and 46 and flows around disc 47 to surface 48 from which it is atomised.

If the flow rate of liquid out of bore 46 is sufficiently reduced atomisation of the liquid may occur from the surfaces adjacent the two exits of bore 46.

Figure 10:
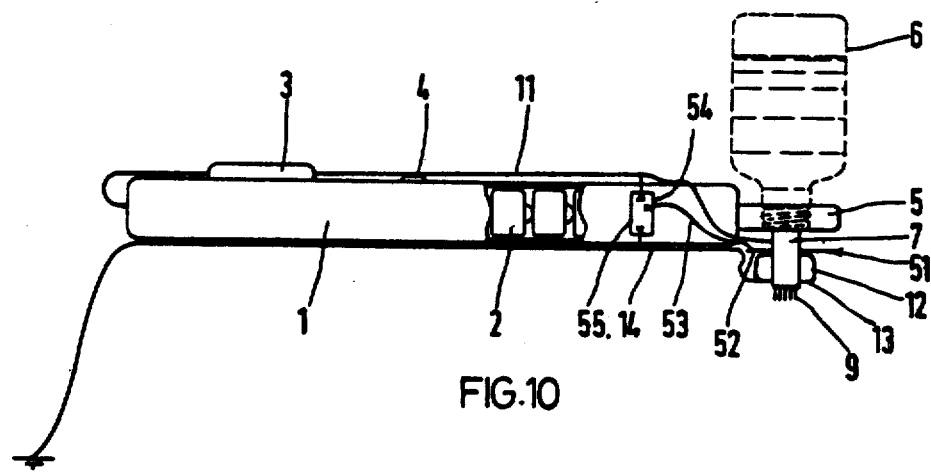
FIG. 10 shows the spray gun of FIG. 1 further comprising a deflector electrode.
Figure 11:
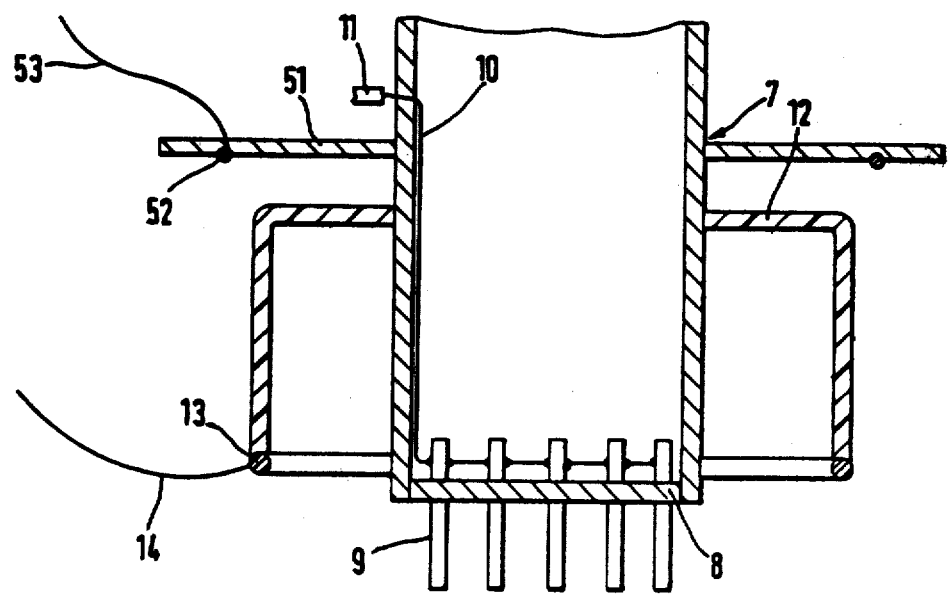
FIG. 11 is a cross-sectional view of the gun nozzle shown in FIG. 10.

The embodiment shown in FIGS. 10 and 11 comprises the spray gun of FIG. 1 fitted with a deflector electrode system to prevent 'back-spray'.

As shown in FIGS. 10 and 11 a disc 51 formed of an insulating material embraces the distributor 7 at its midsection and is held thereon by frictional engagement. Partly embedded in the lower surface of the disc 51 is a deflector electrode 52 in the form of a steel ring. The deflector electrode 52 is connected, via a high voltage cable 53, to a tapping 54 of a potential divider 55. The divider 55 comprises a resistor of $10^{10}$ ohms, connected at one end to the high potential cable 11 and at its other end to the earth lead 14. The high resistance of divider 55 minimises current drain from the high voltage source 3, and serves as a current limiter in the event of a short circuit occurring at the deflector electrode 52.

In operation, with switch 4 in the 'ON' position the deflector electrode 52 receives a high potential from the potential divider 55. Suitable adjustment of the tapping 54 may give any desired potential between zero volts and the potential of the source 3. A typical voltage on the deflector electrode 52 would be 14 KV.

The position of the deflector electrode 52 in relation to the electrode 13 and the spray nozzles 9 may be selected by moving the disc 51 along the length of the distributor 7.

Liquid emerging from the nozzles 9 is atomised and directed by the combined electric field forces set up not only by the high voltage on the nozzles 9 and the local low potential of the electrode 13 but also by the high potential on the deflector electrode 52.

Figure 12:
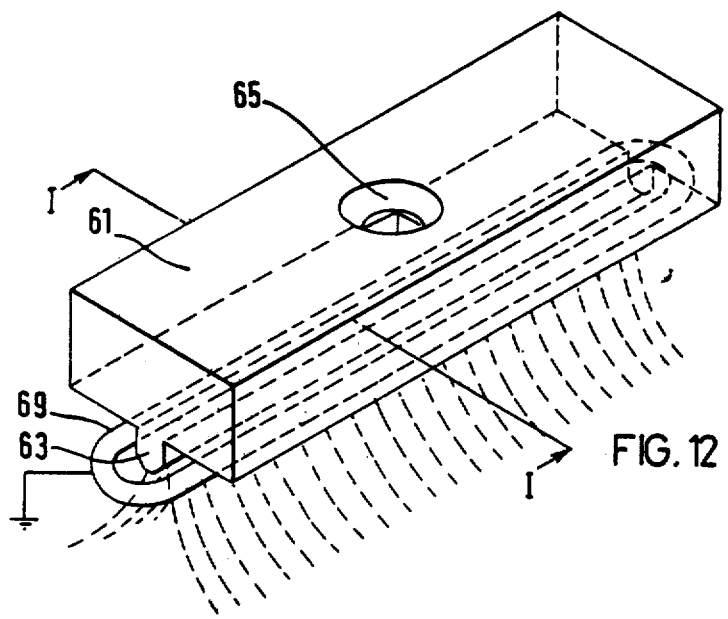
FIG. 12 is a perspective view of a head of a spraying apparatus according to the invention comprising a linear slit arrangement.
Figure 13:
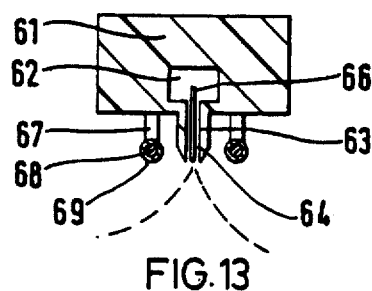
FIG. 13 is a cross-sectional view on the line I—1 of FIG. 10.
Figure 14:
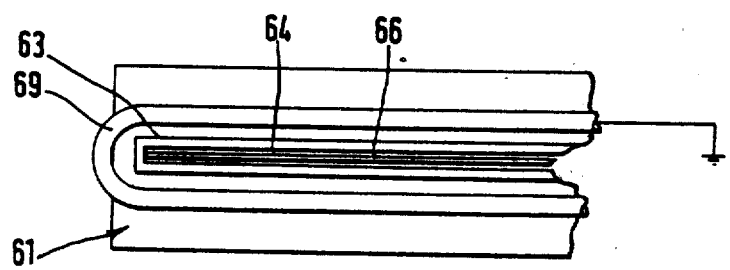
FIG. 14 is an underside view in part of the apparatus of FIG. 10.

Referring to FIGS. 12-14, the head of the spraying apparatus comprises a rectangular body 61 formed of an insulating plastics material and having a rectangular chamber 62. Along the length of its lower face, the body 61 has an integrally formed upstanding projection 63 having a longitudinal slit 64 which connects with chamber 62. The upper face of the body 61 has an aperture 65, adapted to receive (by means not shown) a liquid to be sprayed, and which communicates with chamber 62.

The slit 64 is divided by a conducting surface formed of a thin metal sheet 66 connected to a source of high potential (not shown). Held by supports 67 adjacent the projection 63 is an earthed metal wire 68 enclosed in a sheath 69 formed of an insulating plastics material.

In operation with the high potential applied to the metal sheet 66, liquid to be sprayed enters the chamber 62, via the aperture 65. It emerges from the slit 64 where it is atomised adjacent the metal sheet 66. The wire 68 acts as a field intensifying electrode on both sides of the metal sheet 66. Because it has an insulated protective surface the metal wire 68 can be disposed closer to the metal sheath 66 than if it were not so insulatd, and also with a greatly reduced risk of arcing.

In an alternative embodiment the conducting surface may comprise a metal wire.

In a further embodiment utilising the linear slit arrangement a multiplicity of wire or metal sheet conducting surfaces in parallel and disposed between a multiplicity of such sheathed wire field intensifying electrodes is used. Such an arrangement allows of an increase in the volume of liquid to be sprayed.

The various devices described are particularly useful in the process of the invention, that is to say, in spraying liquid pesticides at ultra-low volume. They may easily be made portable and self-contained, being conveniently powered by low output power sources such as dry cells, piezoelectric sources or photoelectric sources. The process of the invention has particular advantages over known methods of spraying liquid pesticides because it can give a more even coating of pesticides on foliage. Electrostatic forces direct the spray particle to their target, reducing drift, and enable leaves to be coated on both sides. Liquid pesticidal compositions sprayed by the process of the invention may be for example insecticides, fungicides and herbicides. Typically they are in the form of solutions or dispersions of a pesticide in a pesticidally inert organic diluent (e.g. a liquid hydrocarbon) but it is also possible to spray liquid pesticides substantially undiluted. Because deposition is uniform, drift is minimised, and low flow-rates can be used, the apparatus is particularly suitable for applying pesticides undiluted or in highly concentrated formulations (ultra-low volume spraying).

What I claim is:

1. A spraying apparatus for spraying a liquid onto a plant comprising at least two spraying devices mounted on a boom each such spraying device comprising: a spray-head having an at least electrically semi-conducting surface; means for electrically charging the spray-head surface to a potential of the order of 1-20 kilovolts; means for delivering spray liquid to the surface; a field intensifying electrode mounted adjacent to the spray-head surface; and means for connecting the field intensifying electrode to earth; the electrode being so sited relative to the spray-head surface that when the spray-head surface is charged, the electrostatic field thereat causes liquid thereon to atomise without substantial corona discharge to form electrically charged particles which are projected past the electrode and into contact with the plant.

2. A tractor attachment for atomising liquid pesticide to form charged atomised spray particles and to project them along trajectories determined primarily by electrostatic forces to contact plants growing in the earth, said attachment comprising: a boom attachable to a tractor; sprayheads mounted on said boom each having an at least semi-conducting external surface defining a spray orifice; means for electrically charging each sprayhead surface to a potential of the order of 20 kilovolts; means to flow liquid to and through each orifice under gentle hydrostatic pressure; a field-intensifying electrode mounted adjacent to each orifice and aside from and asymmetrically with respect to each said trajectory; and means for electrically connecting said field-intensifying electrode to the earth in which the electrode being so sited relative to the surface that when the surface is charged by the charging means the electrostatic field thereat is sufficient without substantial corona discharge to draw the liquid out into a regular pattern of ligaments, which ligaments break up into a cloud of charged atomised spray particles which follow said trajectories to the plants so that the cloud wraps around the leaves of the plants and coats both the upper and lower surfaces of the leaves.

3. In combination with a powered vehicle a boom mounted on the vehicle and at least two spraying devices mounted on the boom for spraying a liquid onto a plant, each such spraying device comprising: a sprayhead having an at least electrically semi-conducting surface; means for electrically charging the spray-head surface to a potential of the order of 1–20 kilovolts; means for delivering spray liquid to the surface; a field intensifying electrode mounted adjacent to the sprayhead surface; and means for connecting the field intensifying electrode to earth; the electrode being so sited relative to the spray-head surface that when the spray-head surface is charged, the electrostatic field thereat causes liquid thereon to atomise without substantial corona discharge to form electrically charged particles which are projected past the electrode and into contact with the plant.

4. In combination with a tractor an attachment for atomising liquid pesticide to form charged atomised spray particles and to project them along trajectories determined primarily by electrostatic forces to contact plants growing in the earth, said attachment comprising: a boom attached to the tractor; sprayheads mounted on said boom each having an at least semi-conducting external surface defining a spray orifice; means for electrically charging each sprayhead surface to a potential of the order of 20 kilovolts; means to flow liquid to and through each orifice under gentle hydrostatic pressure; a field-intensifying electrode mounted adjacent to each orifice and aside from and asymmetrically with respect to each said trajectory; and means for electrically connecting said field-intensifying electrode to the earth in which the electrode being so sited relative to the surface that when the surface is charged by the charging means the electrostatic field thereat is sufficient without substantial corona discharge to draw the liquid out into a regular pattern of ligaments, which ligaments break up into a cloud of charged atomised spray particles which follow said trajectories to the plants so that the cloud wraps around the leaves of the plants and coats both the upper and lower surfaces of the leaves.

* * * * *